(12) United States Patent
Nering (10) Patent No.: US 6,280,134 B1
(45) Date of Patent: *Aug. 28, 2001

(54) APPARATUS AND METHOD FOR AUTOMATED CASSETTE HANDLING

(75) Inventor: Eric A. Nering, Modesto, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/877,676

(22) Filed: Jun. 17, 1997

(51) Int. Cl.$^7$ ................................................ B65G 49/07
(52) U.S. Cl. .................... 414/217; 414/937; 414/940; 414/805
(58) Field of Search .................. 414/217, 609, 414/416, 937, 939, 940, 805, 806, 222, 811; 198/465.4, 465.1, 370.01, 861.1, 346.1

(56) References Cited

U.S. PATENT DOCUMENTS

| | | | | |
|---|---|---|---|---|
| 4,278,380 | * | 7/1981 | Guarino | 414/217 |
| 4,682,927 | * | 7/1987 | Southworth et al. | 414/217 |
| 4,701,251 | | 10/1987 | Beardow . | |
| 4,825,808 | | 5/1989 | Takahashi et al. . | |
| 4,923,054 | * | 5/1990 | Ohtani et al | 414/937 X |
| 4,936,734 | * | 6/1990 | Osada | 414/940 X |
| 5,004,396 | * | 4/1991 | Focke | 198/465.4 X |
| 5,007,522 | * | 4/1991 | Focke et al. | 414/609 X |
| 5,024,570 | | 6/1991 | Kiriseko et al. | 414/222 |
| 5,058,526 | | 10/1991 | Matsushita et al. . | |
| 5,372,471 | * | 12/1994 | Wu | 414/940 X |
| 5,382,127 | * | 1/1995 | Garric et al. | 414/940 X |
| 5,388,945 | * | 2/1995 | Garric et al. | 414/217 |
| 5,391,035 | * | 2/1995 | Krueger | 414/217 |
| 5,404,894 | * | 4/1995 | Shiraiwa | 414/937 X |
| 5,442,416 | | 8/1995 | Tateyama et al. . | |
| 5,443,346 | * | 8/1995 | Murata et al. | 414/940 X |
| 5,536,128 | * | 7/1996 | Shimoyashiro et al. | 414/940 X |
| 5,570,990 | * | 11/1996 | Bonora et al. | 414/940 X |
| 5,570,994 | * | 11/1996 | Somekh et al. | 414/939 X |
| 5,586,585 | * | 12/1996 | Bonora et al. | 141/93 |
| 5,630,690 | * | 5/1997 | Salzman | 414/217 |
| 5,700,127 | | 12/1997 | Harada et al. . | |
| 5,769,949 | * | 6/1998 | Cienkus et al. | 198/465.4 X |
| 5,788,448 | * | 8/1998 | Wakamori et al. | 414/940 X |
| 5,846,328 | | 12/1998 | Aruga et al. . | |
| 5,863,170 | | 1/1999 | Boitnott et al. . | |

FOREIGN PATENT DOCUMENTS

| | | | |
|---|---|---|---|
| 0 797 240 A2 | 9/1997 | (EP) . | |
| 5-47896 | * 2/1993 | (JP) | 414/940 |
| 6-37165 | * 2/1994 | (JP) | 414/940 |
| 6-69312 | * 3/1994 | (JP) | 414/940 |
| 6-104326 | * 4/1994 | (JP) | 414/939 |
| WO 97/02199 | 1/1997 | (WO) . | |

* cited by examiner

Primary Examiner—Steven A. Bratlie
(74) Attorney, Agent, or Firm—Dugan & Dugan LLP (57) ABSTRACT

An interface for transferring wafer carriers between a conveyor and a process chamber load location is provided. The interface has two portions. The first portion is configured so that a first wafer carrier moving along a wafer carrier transport mechanism (e.g., a conveyor) may travel therethrough. The second portion is configured so that a second wafer contained within the second portion may index between a first position and a second position without obstructing passage of the first wafer carrier through the first portion. The interface contains an indexer/elevator that facilitates wafer carrier coupling and uncoupling from the conveyor, and facilitates wafer transfer to and from wafer handlers that load process chambers. Numerous interfaces can be employed to create semiconductor device fabrication systems and to interconnect various semiconductor device fabrication systems.

29 Claims, 9 Drawing Sheets

APPARATUS AND METHOD FOR AUTOMATED CASSETTE HANDLING

FIELD OF THE INVENTION

The present invention relates generally to semiconductor wafer fabrication systems, and to an improved apparatus and method for transferring semiconductor wafers and semiconductor wafer carriers within a given semiconductor wafer fabrication tool, or within a collection of semiconductor wafer fabrication tools.

BACKGROUND

The semiconductor industry continuously searches for ways to reduce the cost per wafer processed. Several factors that affect processing costs are the costs associated with maintaining a clean room environment; equipment costs, including high precision wafer handling equipment; labor costs and the cost associated with non-value added time such as the time required for wafer transport between process chambers. Wafer costs can be reduced significantly by reducing the footprint of equipment requiring a clean room environment and by reducing the need for expensive multi-axis wafer handlers. Further reductions in wafer cost are achieved by reducing the time required to transfer wafers between a wafer carrier and a process chamber. Therefore the semiconductor fabrication industry continuously seeks improved fabrication tool configurations so as to reduce the fabrication tool's footprint, and so as to reduce the cost of fabrication tool components by simplifying the wafer transfer process.

Accordingly a need exists for a method and apparatus that, in a reduced footprint configuration, speeds and simplifies wafer transfer both within a given fabrication tool and within a collection of fabrication tools.

SUMMARY OF THE PREFERRED EMBODIMENTS

The present invention provides an improved apparatus and method for transferring wafer carriers between processing locations, and for extracting wafers from the wafer carrier and transferring them to individual process chambers. The inventive apparatus comprises an improved interface between a conveyor and one or more process chambers. In a preferred embodiment the interface comprises a chamber having two portions; the first portion being configured such that a conveyor may extend therethrough and the second portion being configured such that a first wafer carrier positioned on an elevator within the second portion may index between a first position and a second position without obstructing the passage of a second wafer carrier traveling through the first portion. Alternatively, if each wafer carrier is required to stop at each interface, the second portion may be configured without regard for the unobstructed passage of wafer carriers through the first portion. The second portion of the chamber has at least one window for connecting at least one process chamber.

Preferably, the first and second positions are top and bottom positions, such that when the interface connects a single process chamber, the top position will allow a wafer handler associated with the process chamber to extract the bottom wafer from the wafer carrier and transfer it to the process chamber via the first window; and the bottom position will allow the wafer handler to extract the top wafer from the wafer carrier and transfer it to the process chamber via the first window. The first wafer carrier may index to a plurality of positions between the top and bottom positions, allowing each wafer within the wafer carrier to be extracted via the first window. Similarly, when the interface connects more than one process chamber, the top position will align the bottom wafer with the window having the highest elevation and the bottom position will align the top wafer with the window having the lowest elevation.

The process chamber is positioned relative to the interface such that the wafer handler associated with the process chamber travels in a straight line (i.e., exhibits single axis movement) between the interface and the process chamber. In this manner, the present invention advantageously replaces the multi-axis movement required of prior art wafer handlers and the greater expense and larger footprint associated therewith. Within the present invention each wafer transfer mechanism (e.g., the conveyor, the elevator and the wafer handlers) performs only single axis movement. Further, in the present invention, the wafer handlers travel a much shorter distance than do the wafer handlers of prior art systems. Thus, the transportation system of the present invention is also more reliable than prior art systems.

Unlike conventional wafer handlers, the present invention utilizes a single indexer to perform several functions: removing a wafer carrier from the conveyor, transporting the wafer carrier to a position for process chamber loading, and indexing the wafer carrier to transfer individual wafers to the wafer handler for individual wafer movements. Thus, the present invention provides a simpler, lower-cost mechanism for performing several necessary wafer transfer functions.

In one aspect, the interface of the present invention has a plurality of ports and thus allows a plurality of wafer handlers to access wafers at any given time. The inventive Interface therefore reduces wafer transfer time and facilitates wafer handoff between a pair of process chambers which require similar atmospheres.

In a further aspect, the inventive interface comprises a conventional pod opening mechanism within the elevator chamber which causes the cover of a pod-type wafer carrier to remain above as the base plate of the a pod type wafer carrier and the cassette mounted thereon descend within the second portion of the elevator chamber. In this manner the pod-type wafer carrier may be simply and efficiently opened as the wafer carrier moves into position for wafer extraction.

The inventive interface connects a number of process chambers to provide wafer/wafer carrier transport within an inventive fabrication tool. Further, in an aspect where the inventive interface connects a first conveyor to a conveyor positioned at a distant elevation, the interface of the present invention provides a method and apparatus for factory-wide automated semiconductor processing.

DETAILED DESCRIPTION OF THE DRAWINGS

Figure 1A:
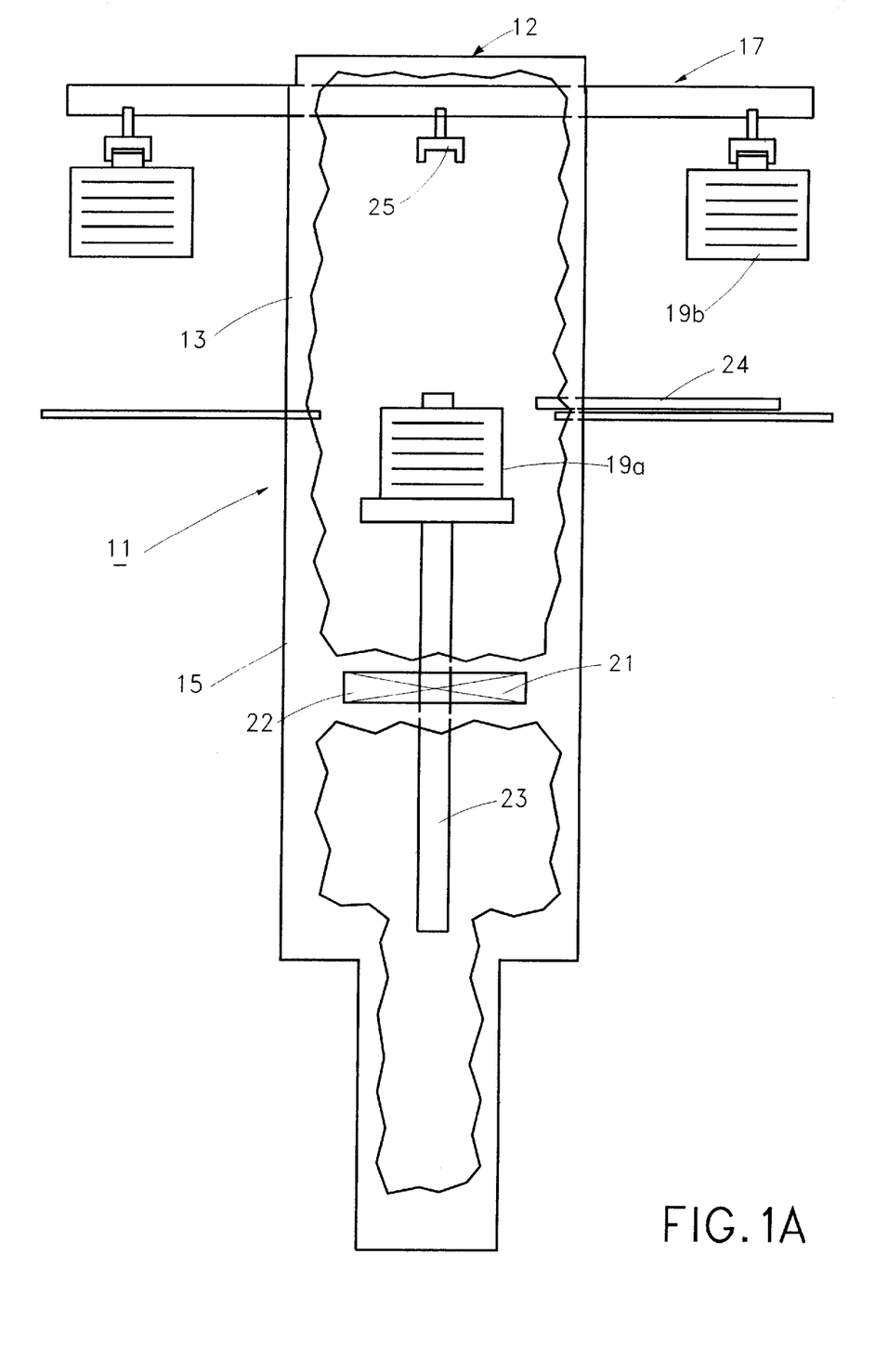
FIGS. 1A and 1B are sequential side elevational views of an inventive interface of the present invention showing a wafer carrier being loaded into a second portion of the interface.
Figure 1B:
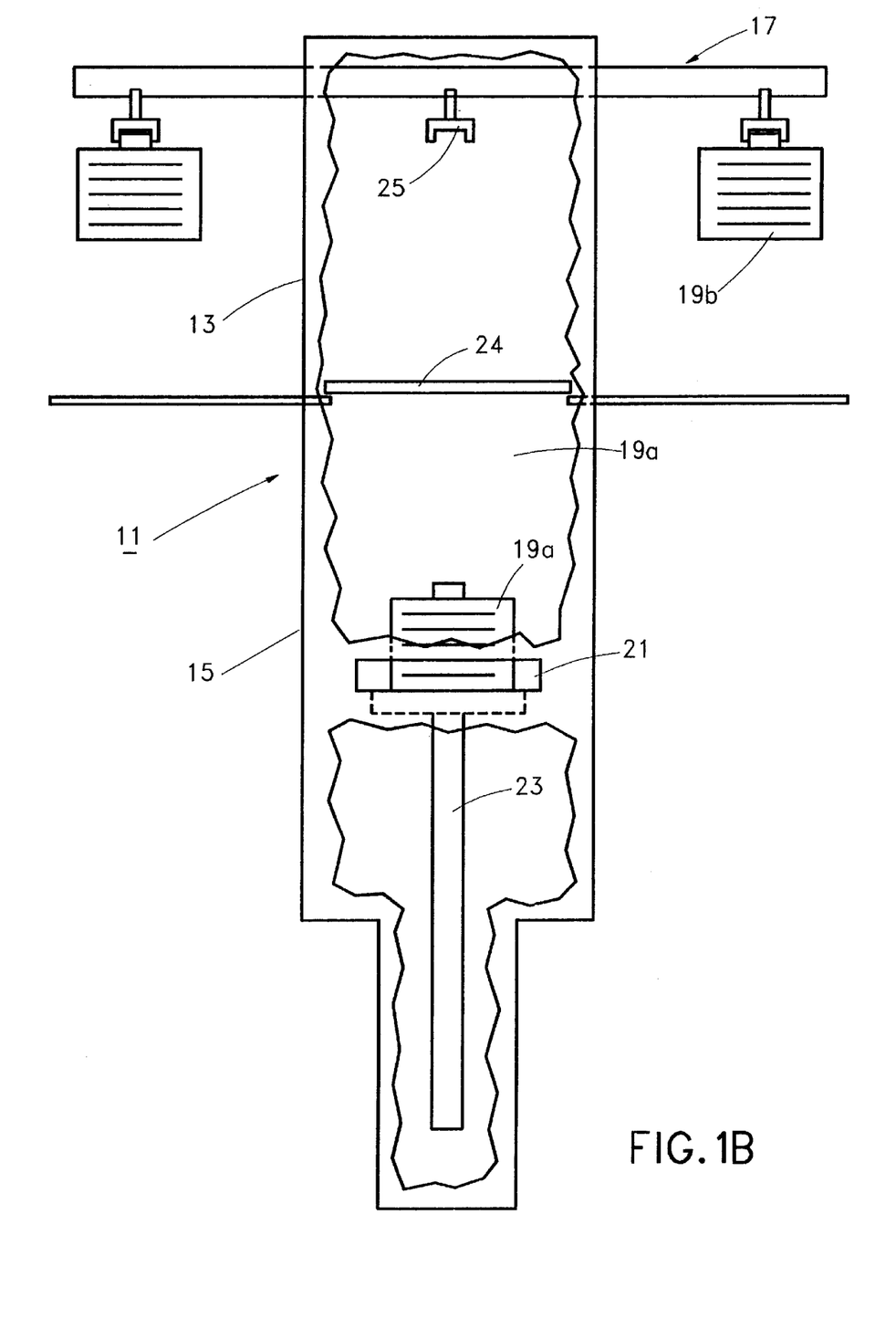

FIGS. 1A and 1B are side elevational views of an inventive interface 11 of the present invention showing a first wafer carrier 19a being loaded into a second portion of the interface. The interface 11 is comprised of a chamber 12 having first portion 13 and a second portion 15. The first portion 13 is configured such that a conveyor 17 may extend therethrough, and the second portion 15 is configured such that the first wafer carrier 19a within the second portion 15 may index between a first position and a second position without obstructing the passage of a second wafer carrier 19b traveling through the first portion 13. Preferably the first position is a top position which aligns the bottom wafer (assuming the wafer carrier is fully loaded with wafers) for extraction through a window 21 located within the second portion 15, and the second position is a bottom position which aligns the top wafer (assuming the wafer carrier is fully loaded with wafers) for extraction through the window 21. The interface 11 further comprises a conventional indexer/elevator 23 for receiving a wafer carrier in the first portion 13 and for indexing the wafer carrier between various positions in the second portion 15. Like the indexer/elevator 23, the conveyor 17 may comprise any conventional conveyor. As shown in FIGS. 1A and 1B, the conveyor 17 is an overhead type conveyor, having a plurality of latching mechanisms 25 for connecting wafer carriers. Preferably the conveyor 17 is capable of transporting objects in two directions (e.g., is a two-way conveyor).

In one aspect the second portion 15 is a sealed chamber having a door 24 which opens (as shown in FIG. 1A) to receive a wafer carrier (e.g., the first wafer carrier 19a) from the first portion 13 and closes after the wafer carrier lowers into the second portion (as shown in FIG. 1B). In this aspect the window 21 comprises a sealable opening such as a slit valve 22. Thus, the second portion 15 may maintain a vacuum environment.

Figure 2A:
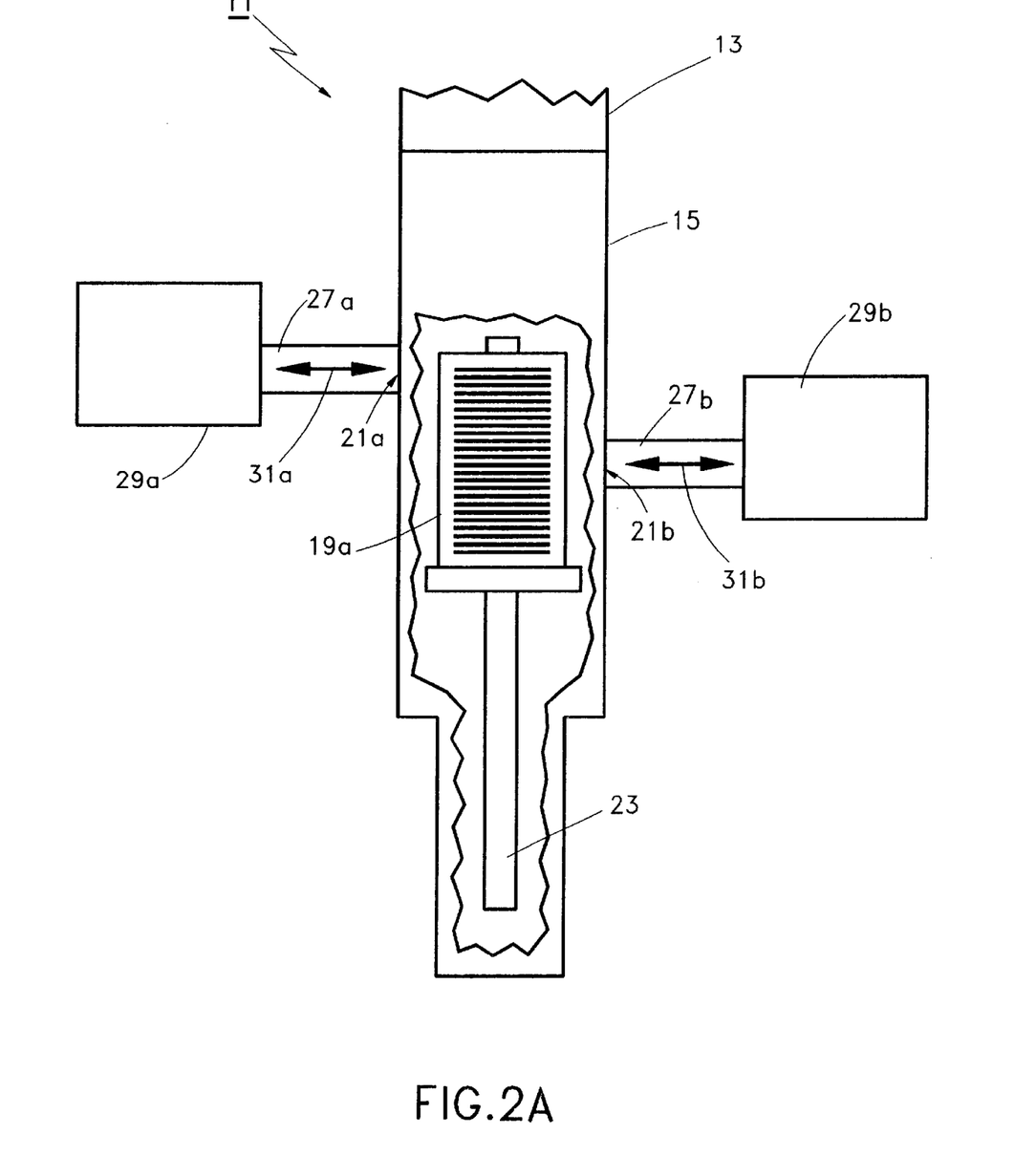
FIG. 2A is a front elevational view of the inventive interface of FIGS. 1A and 1B.
Figure 2B:
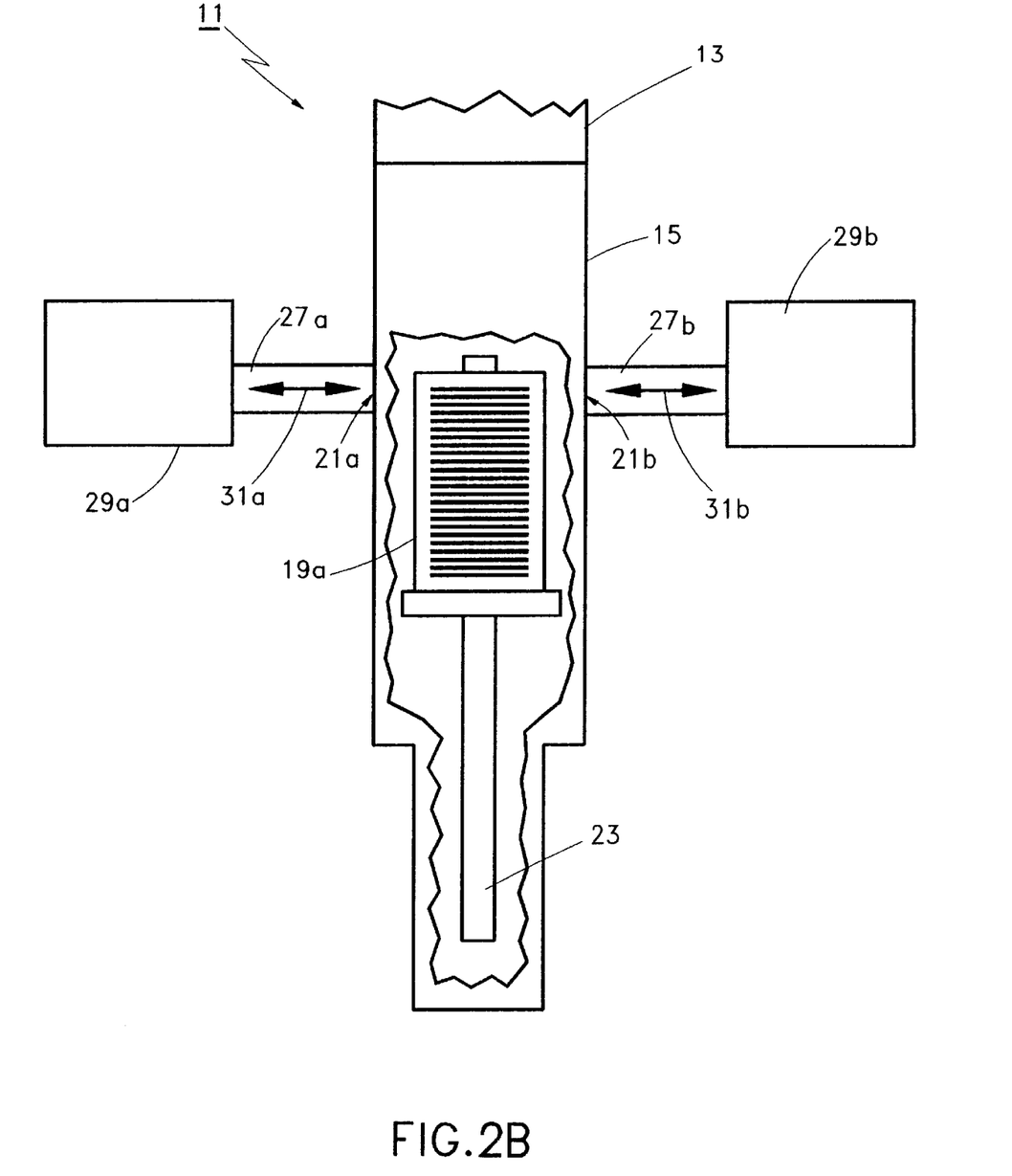
FIG. 2B is a front elevation view of a second aspect of the inventive interface of FIGS. 1A and 1B, wherein the process chambers are elevationally aligned.

In a further aspect the second portion 15 may comprise a plurality of the windows 21 (as shown in FIGS. 2A and 2B) thus allowing for extraction of more than one wafer at FIG. 2A is a front elevational view of the inventive interface 11 of FIGS. 1 and 1B wherein the second portion 15 comprises a first window 21a and a second window 21b. As shown in FIG. 2A, the first window 21a connects a first port 27a and the second window 21b connects a second port 27b. Each port 27a, 27b further connects a first process chamber 29a and a second process chamber 29b, respectively, and contains a first wafer handler 31a and a second wafer handler 31b, respectively, for transferring wafers from the second portion 15 to the respective process chamber.

Preferably the first window 21a and the second window 21b are positioned such that if a wafer carrier is centered within second portion 15, the first window 21a and the second window 21b are spaced by half the distance of the active wafer carrier slots. For example, in a twenty-four slot wafer carrier the first window 21a is adjacent slot one and the second window 21b is adjacent slot thirteen (wherein slot one is the top-most wafer carrier slot, and slot thirteen is thirteen wafer carrier slots below slot one). In this configuration, the wafer carrier 19a need only index upwardly eleven times to provide each wafer access to a process chamber (i.e., to the first process chamber 29a or to the second process chamber 29b). Additional windows can be added in the same manner (e.g., a third window (not shown) adjacent slot seven, coupled to a third process chamber 29c (not shown), and a fourth window (not shown) adjacent slot nineteen, coupled to a fourth process chamber 29d (not shown), etc.). The configuration of FIG. 2A is most advantageous when each process chamber 29a, 29b performs the same process. In this manner a wafer carrier of wafers can be processed more quickly (e.g., in half, or a quarter, etc., of the time, depending on the number of identical process chambers). Similarly, the configuration of FIG. 2A can be advantageously employed for sequential processing when the first process chambers 29a, performs a first process, and the second process chamber 29b performs a second process.

In operation, (with reference to FIGS. 1A, 1B and 2A) a plurality of wafer carriers are transported by the conveyor 17. The first wafer carrier 19a travels into the first portion 13 of the interface 11 and, assuming the interface 11 connects a process chamber to which the first wafer carrier 19a is to deliver wafers, the latching mechanism 25 carrying the first wafer carrier 19a stops within the first portion 13. The door 24 opens as the indexer/elevator 23 elevates. The indexer/elevator 23 engages the first wafer carrier 19a, causing the latching mechanism 25 to release the first wafer carrier 19a onto the indexer/elevator 23 as shown in FIG. 1A. The indexer/elevator 23 then lowers the first wafer carrier 19a from the first portion 13 into the second portion 15 and the door 24 closes as shown in FIG. 1B. Within the second portion 15 the indexer/elevator 23 lowers the first wafer carrier 19a to the first position such that (with reference to FIG. 2A) the first wafer handler 31a may extend through the first window 21a to a position immediately below a first wafer in wafer slot one of the first wafer carrier 19a, and such that the second wafer handler 31b may extend through the second window 21b to a position immediately below a second wafer in wafer slot thirteen of the first wafer carrier 19a (i.e., the first and second wafers to be processed are positioned adjacent the first and second process chambers 29a, 29b).

Thereafter the first wafer handler 31a and the second wafer handler 31b extend as the window 21a and the window 21b open (assuming the second portion 15 exhibits the correct pressure/vacuum/gas atmosphere). After the first wafer handler 31a and the second wafer handler 31b are in position beneath the first and second wafers, respectively, (beneath wafer slots one and thirteen), the indexer/elevator 23 indexes downward a sufficient distance such that the first and second wafers are supported by the first wafer handler 31a and the second wafer handler 31b, respectively. The first wafer handler 31a and the second wafer handler 31b then retract, respectively, carrying the first and second wafers; the first window 21a and the second window 21b close and the process chamber slit valves open. The first wafer handler 31a extends into the first process chamber 29a deposits the first wafer, retracts and the first process chamber slit valve closes, as the second wafer handler 31b extends into the second process chamber 29b deposits the second wafer, retracts and the second process chamber slit valve closes. When processing is complete the process chamber slit valves open and the wafer handlers 31a, 31b extract the wafers from the respective process chambers, the first window 21a and the second window 21b open and the wafer handlers 31a, 31b extend therethrough, such that the first and second wafers respectively are immediately above the first and thirteenth wafer slots of the first wafer carrier 19a. Thereafter, the indexer/elevator 23 indexes upwardly a sufficient distance such that the first and second wafers are lifted off their respective wafer handlers by the first and thirteenth wafer slots. The wafer handlers 31a, 31b then retract, the indexer/elevator 23 indexes upwardly, moving the first wafer carrier 19a such that the first wafer handler 31a may extend through the first window 21a to a position immediately below a third wafer (e.g., below the second wafer slot) and such that the second wafer handler 31b may extend through the second window 21b to a position immediately below a fourth wafer (e.g., below the fourteenth wafer slot). Thereafter the wafer transport and processing described above repeats until each wafer within the first wafer carrier 19a has been processed by either the first process chamber 29a or the second process chamber 29b. Alternatively, if the first process chamber 29a and the second process chamber 29b perform different processes, the indexer/elevator 23 must index a sufficient number of times for each wafer to be processed by each process chamber 29a, 29b. The configuration of FIG. 2A advantageously provides simultaneous access to more than one wafer at a time, and when identical processes are employed, reduces the number of indexing motions required per wafer carrier.

After each wafer within the first wafer carrier 19a is fully processed, the first wafer handler 31a and the second wafer handler 31b retract and the door 24 opens as the indexer/elevator 23 elevates (as shown in FIG. 1A). Thereafter the indexer/elevator 23 elevates the first wafer carrier 19a until it engages the latching mechanism 25, (either the latching mechanism 25 which previously carried the first wafer carrier 19a or another latching mechanism 25). Although, in this example, the first wafer handler 31a and the second wafer handler 31b move simultaneously, the first wafer handler 31a and the second wafer handler 31b may move synchronously or asynchronously and either may load or unload wafers as required, independent of the other. Similarly, the motion of the indexer/elevator 23 and the door 24 may be synchronous or asynchronous.

FIG. 2B is a front elevational view of a second aspect of the inventive interface 11 of FIGS. 1A and 1B, wherein the process chambers 29a, 29b are elevationally aligned. This aspect of the inventive interface could operate in a push-pull configuration, wherein after a first wafer is processed within the first process chamber 29a, the first wafer handler 31a extracts the first wafer from the first process chamber 29a and places it within the first wafer carrier 19a. Thereafter the second wafer handler 31b immediately extracts the first wafer from the first wafer carrier 19a and transfers it to the second process chamber 29b for processing. While the first wafer is processing within the second process chamber 29b, the indexer/elevator 23 indexes and the first wafer handler 31a loads a second wafer into the first process chamber 29a. This configuration allows a wafer to move from one process chamber to the next in minimal time—thus minimizing non-value added time between sequential processes.

Figure 2C:
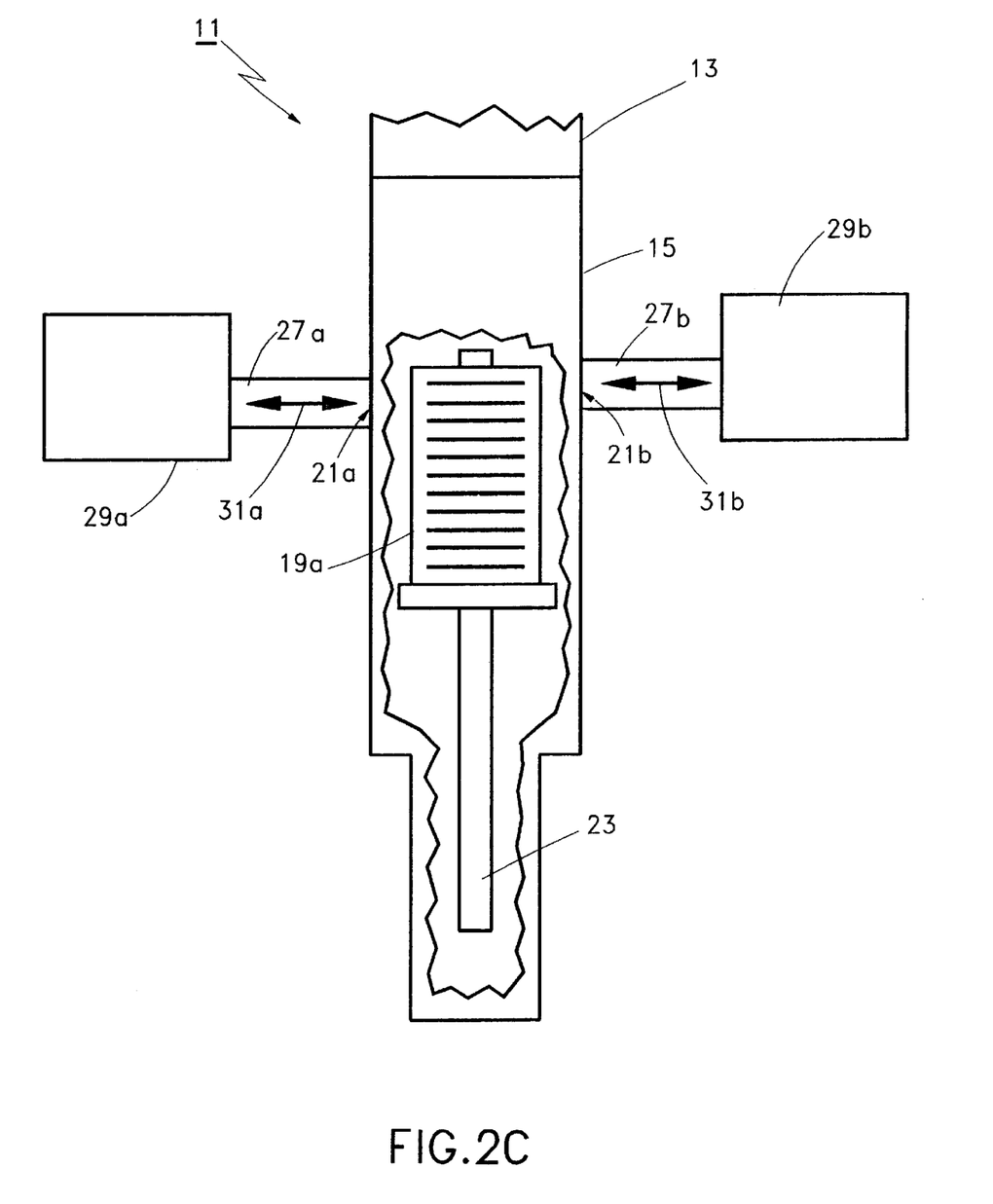
FIG. 2C is a front elevational view of a third aspect of the inventive interface of FIGS. 1A and 1B, wherein the process chambers 29a, 29b are offset a distance of one wafer slot.

FIG. 2C is a front elevational view of a third aspect of the inventive interface 11 of FIGS. 1A and 1B, wherein the process chambers 29a, 29b are offset a distance of one wafer slot. This configuration allows a wafer to move quickly from one process chamber to the next, while minimizing the chamber idle time experienced by the configuration of FIG. 2B. In the configuration of FIG. 2C, after a first wafer is processed within the first process chamber 29a, the first wafer handler 31a places the first wafer within the first wafer carrier 19a, the indexer/elevator 23 indexes one position and the first wafer is transferred to the second process chamber 29b while a second wafer is transferred to the first process chamber 29a. Thus, in the configuration of FIG. 2C the wafer transfer time between the first and second process chambers 29a, 29b is somewhat longer than that experienced by the configuration of FIG. 2B, however, process chamber idle time is significantly reduced.

Figure 3A:
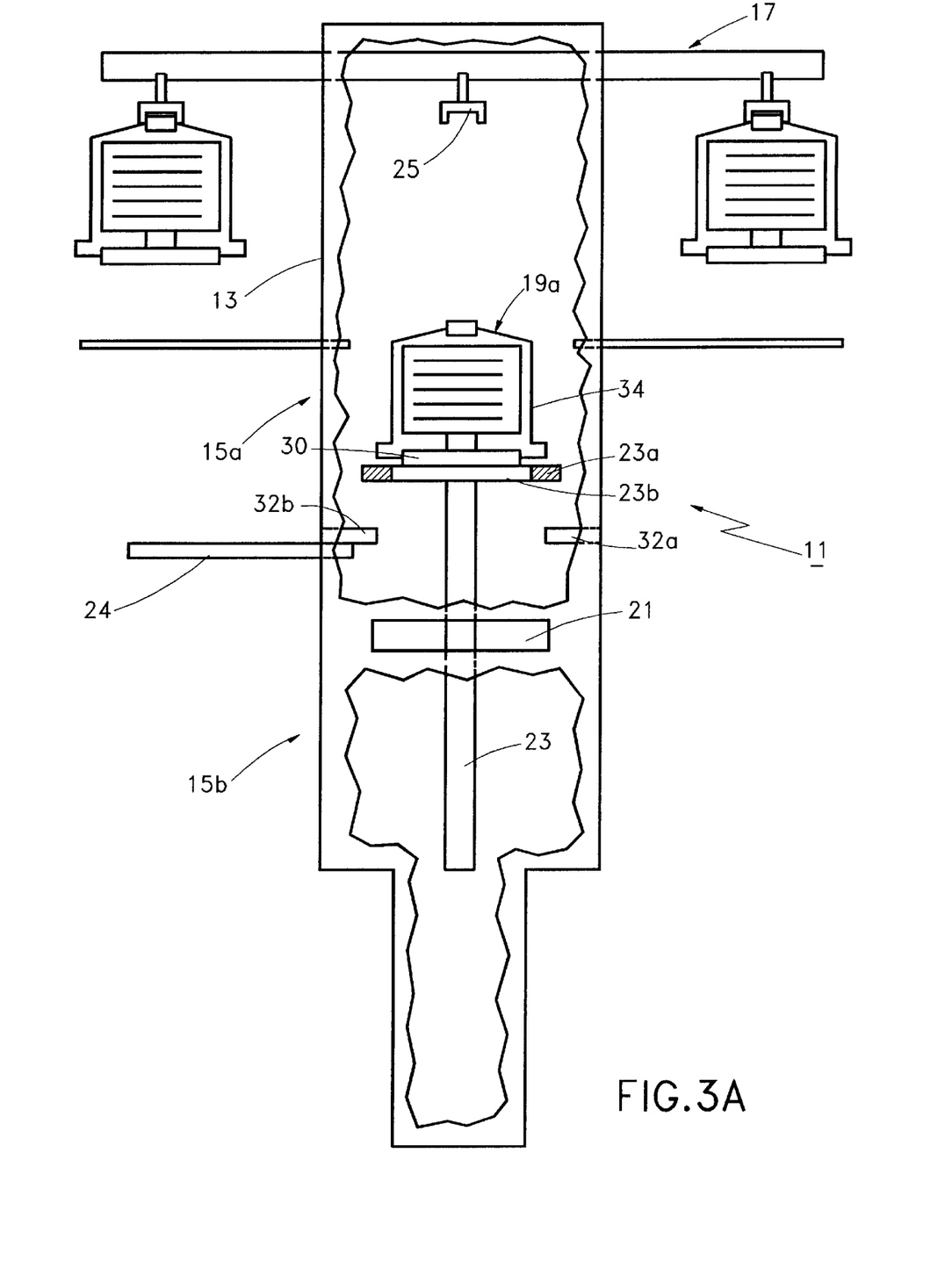
FIGS. 3A and 3B are sequential side elevational views of another aspect of the inventive interface showing the opening of a pod type wafer carrier.
Figure 3B:
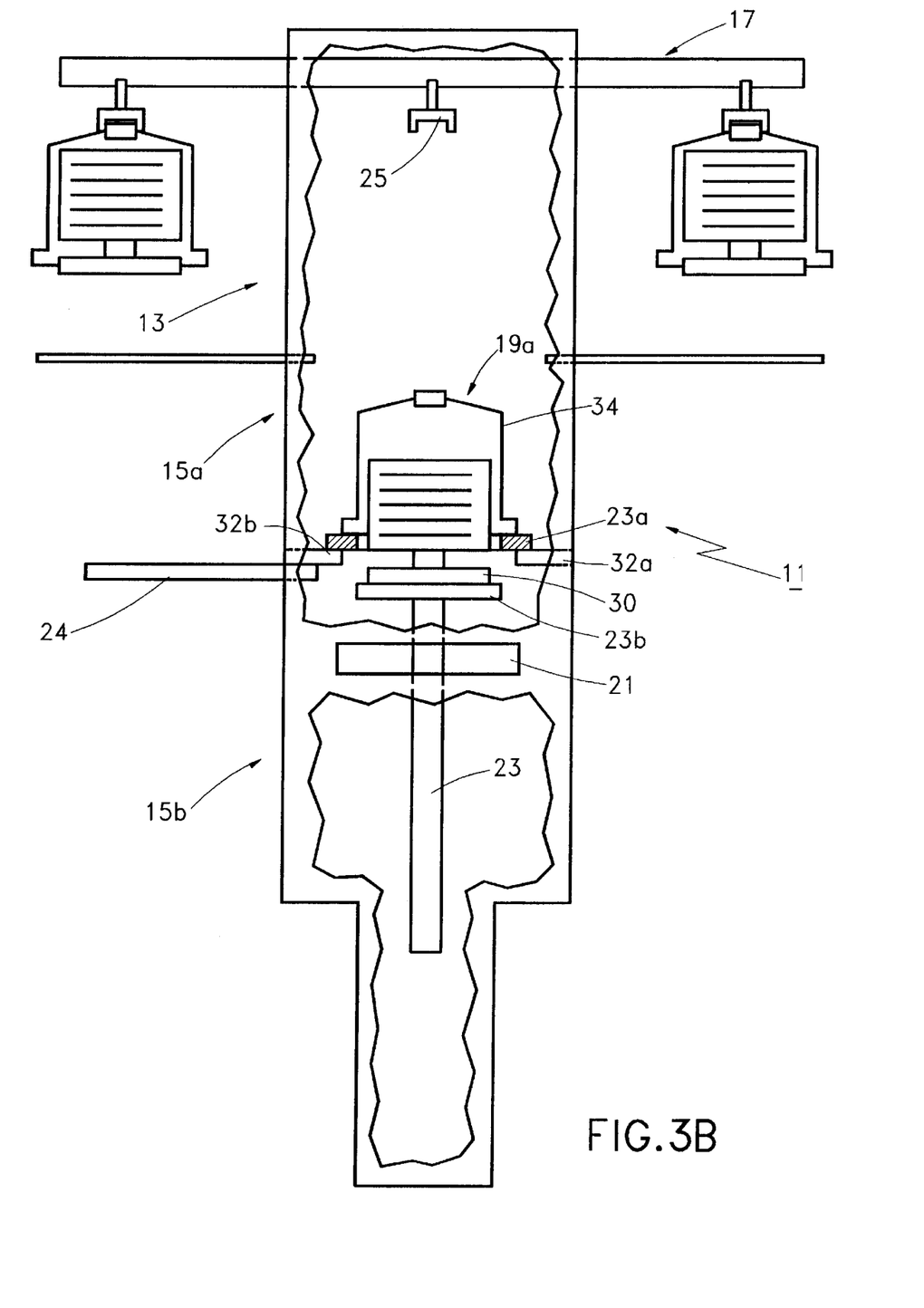

FIGS. 3A and 3B are sequential side elevational views of another aspect of the inventive interface 11 showing the opening of a first pod-type wafer carrier 19a. In this aspect the interface 11 further comprises a conventional pod opening mechanism which generally comprises a pod engaging mechanism 32a, 32b located within the second portion 15 and the indexer/elevator 23 comprises two parts, a cover supporting part 23a and a wafer carrier supporting part 23b. Likewise, the second portion 15 is conveniently described as having two portions; a cover buffering portion 15a of sufficient height to house a cover 34 of the first pod-type wafer carrier 19a, and a wafer exchange portion 15b. The wafer carrier supporting part 23b comprises an o-ring 36 disposed in a groove 38 in the surface of the supporting part 23b for sealing against a base 30 of the first pod-type wafer carrier 19a. In the configuration of FIGS. 3A and 3B the door 24 is retractably coupled between the cover buffering portion 15a and the wafer exchange portion 15b. Except for the opening of the pod-type wafer carrier, the inventive interface 11 shown in FIGS. 3A and 3B operates as described above with reference to FIGS. 2A and 2B. Accordingly only the pod opening steps are described with reference to FIGS. 3A and 3B.

In operation, the two part indexer/elevator 23 elevates to engage the first pod-type wafer carrier 19a, causing the latching mechanism 25 to release the first pod-type wafer carrier 19a onto the indexer/elevator 23. As the wafer carrier supporting part 23b contacts the base 30 of the first wafer carrier 19a it is clamped thereto by a clamping means (not shown) such that the o-ring 36 of the wafer carrier supporting part 23b seals any contaminants that may have collected on the base 30 of the first wafer carrier 19a (e.g., as it travels along the conveyor 17) between the base 30 and the wafer carrier supporting part 23b. The region between the base 30 and the wafer carrier supporting part 23b (i.e., the intermediate region) may be vented via small openings in the wafer carrier supporting part 23b, and/or via a leakage path through the indexer/elevator 23 which may optionally be coupled to a pump for pumping the intermediate region. The indexer/elevator 23 then lowers the first pod-type wafer carrier 19a into the cover buffering portion 15a (FIG. 3A). As the indexer/elevator 23 passes from the cover buffering portion 15a into the wafer exchange portion 15b, the cover supporting part 23a of the indexer/elevator 23 contacts and seals against the pod engaging mechanism 32a, 32b via a sealing mechanism 40. Thereafter the wafer exchange portion 15b is pumped to a desired vacuum pressure. A sensor 42 detects that the cover supporting part 23a has contacted the pod engaging mechanism 32a, 32b and the wafer carrier supporting part 23b of the indexer/elevator 23 actuates a conventional latch 44 (located on the base plate 30 of the first pod-type wafer carrier 19a) causing the cover 34 to be unlatched from the base plate 30 of the first pod-type wafer carrier 19a. After the cover 34 is unlatched, the indexer/elevator 23 separates into its two parts (FIG. 3B); the cover supporting part 23a and the cover 34 supported thereby remain in the cover buffering portion 15a, suspended by the pod engaging mechanism 32a, 32b, and the wafer carrier supporting part 23b descends, carrying the cassette of wafers into position for wafer extraction within the wafer exchange portion 15b. In this manner, the first pod-type wafer carrier 19a may be simply and efficiently opened.

Figure 4:
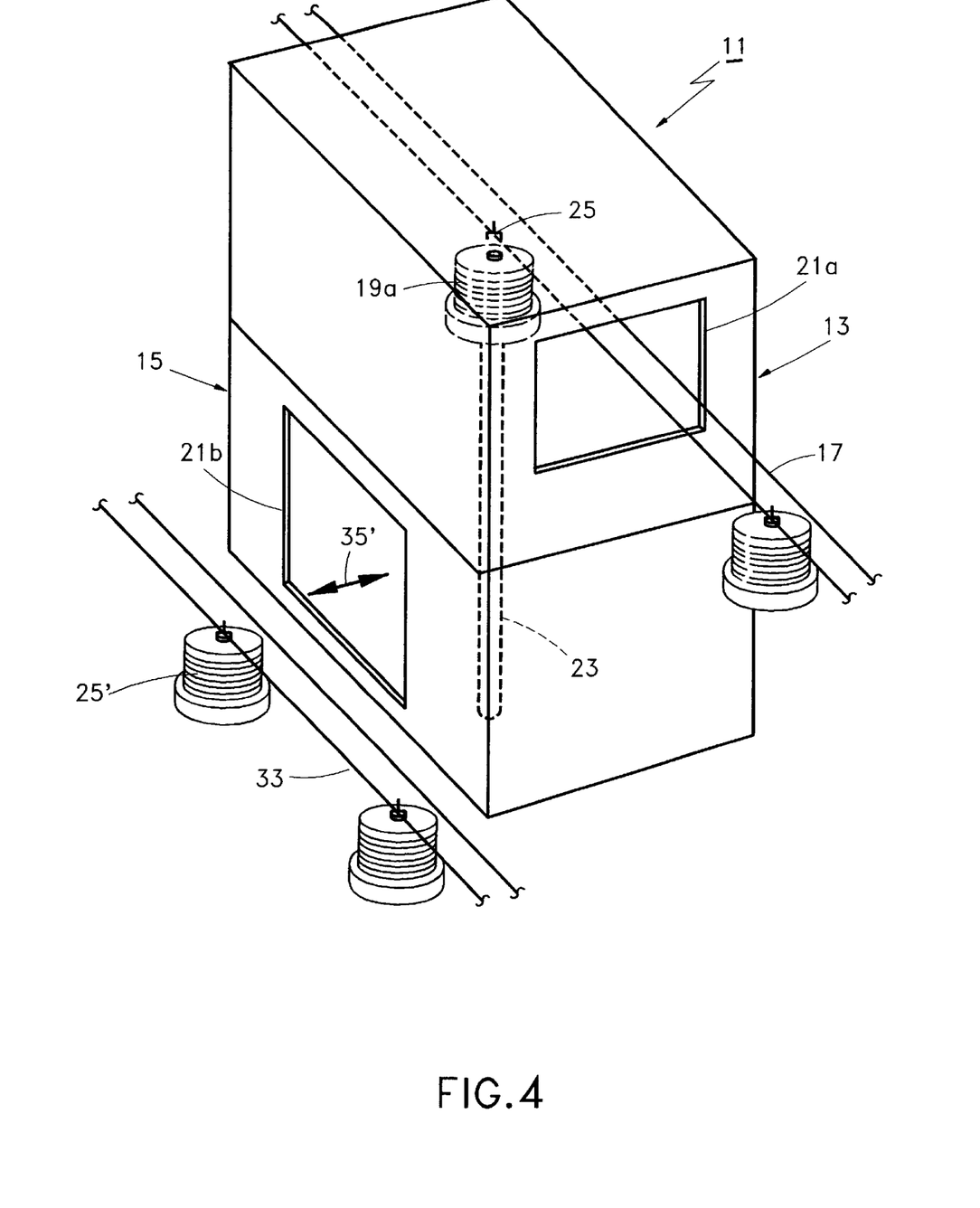
FIG. 4 is a perspective view of a third aspect of the inventive interface of FIGS. 1A and 1B, wherein the interface connects a first conveyor having a first elevation to a second conveyor having a second elevation.

FIG. 4 is a perspective view of a third aspect of the inventive interface 11 of FIGS. 1A and 1B, wherein the interface 11 connects the conveyor 17 positioned at a first elevation, to a distant conveyor 33 (i.e., a conveyor positioned at a second elevation which differs from the first elevation). In this aspect the first and second windows 21a, 21b are sized so as to allow an entire wafer carrier to pass therethrough.

Referring to FIGS. 1A, 1B and 4, in operation the first wafer carrier 19a travels through the first window 21a into the first portion 13 of the interface 11 and stops. The indexer/elevator 23 elevates to engage the first wafer carrier 19a causing the latching mechanism 25 carrying the first wafer carrier 19a to release the first wafer carrier 19a onto the indexer/elevator 23 (as used herein "elevate" refers to the operation of the indexer/elevator and therefore includes lifting or lowering). The indexer/elevator 23 then lowers the first wafer carrier 19a from the first portion 13 to a position within the second portion 15 such that the wafer carrier handler 35' (FIG. 4) may extend through the second window 21b and transport the first wafer carrier 19a to a latching mechanism 25' of the distant conveyor 33. The wafer carrier handler 35' transports the first wafer carrier 19a to the distant conveyor 33 and the indexer/elevator 23 is free to receive another wafer carrier from the first portion 13. This aspect of the invention advantageously allows a plurality of fabrication tools to be interconnected to form an automated semiconductor processing system. For example, conveyor 17 may be an overhead conveyor which connects an entire factory of semiconductor fabrication tools via a plurality of the interfaces 11 (i.e., a network conveyor). In such a configuration, a wafer carrier handler 35' at each of the plurality of interfaces 11 would transfer wafer carriers to a distant conveyor 33 associated with a respective fabrication tool (i.e., a local conveyor). In this manner the inventive interface 11 facilitates factory wide automation, and the cost savings associated therewith.

Figure 5:
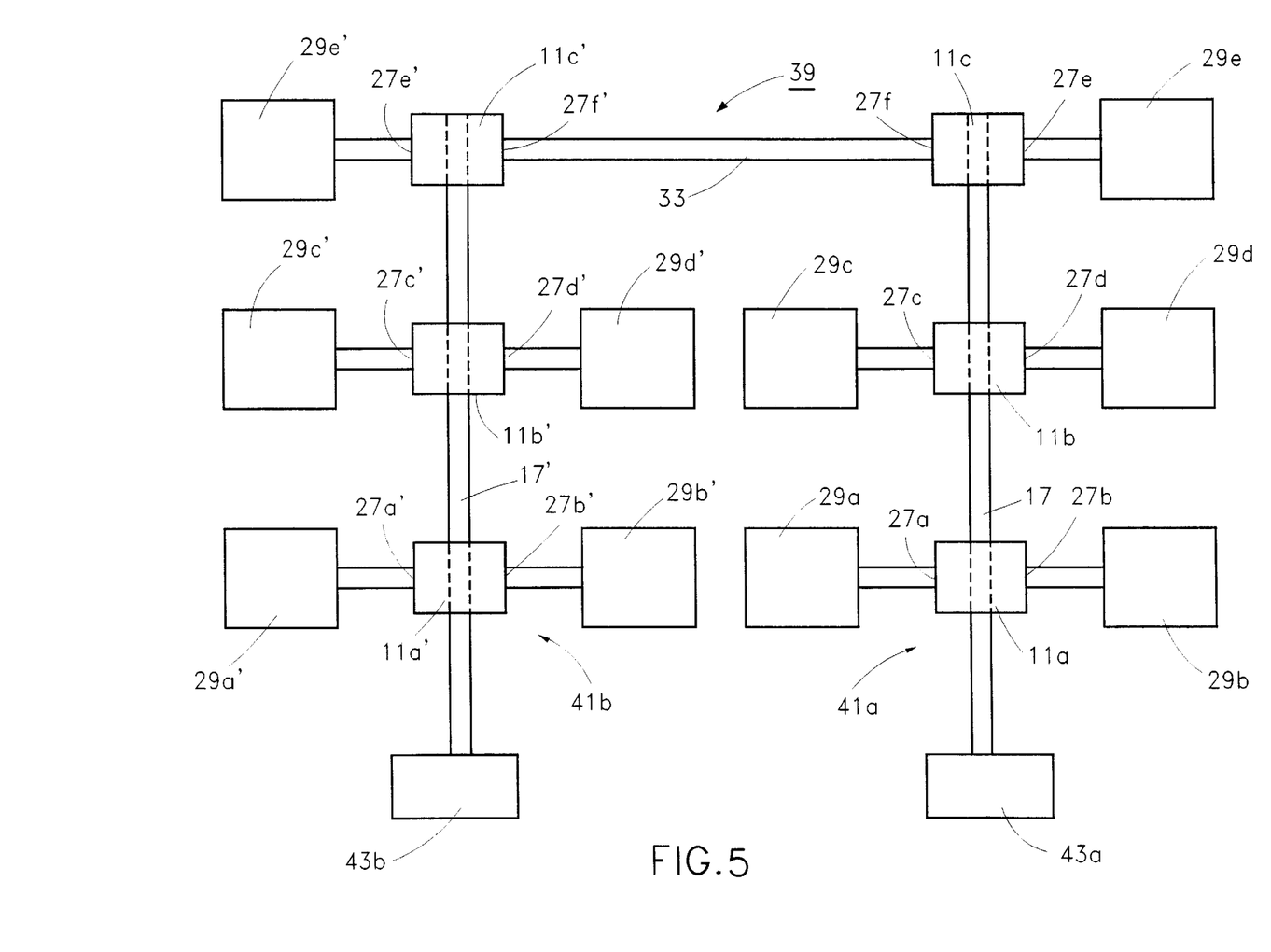
FIG. 5 is a top plan view of an automated semiconductor processing system which employs the inventive interface of FIG. 4.

FIG. 5 is a top plan view of an automated semiconductor processing system 39 which employs the inventive interface of FIG. 4. As shown in FIG. 5 the automated semiconductor processing system 39 comprises a first fabrication tool 41a and a second fabrication tool 41b. The first fabrication tool 41a and the second fabrication tool 41b are connected by a pair of interfaces 11c, 11c' and a distant conveyor 33 as described with reference to FIG. 4. Each fabrication tool 41a, 41b comprises a plurality of the interfaces 11a–c as shown and described with reference to FIGS. 1–4. The interfaces 11a–c connect one or more process chambers and/or a distant conveyor in either an elevationally offset configuration, an elevationally aligned configuration or any combination thereof. Specifically, within the first fabrication tool 41a a first interface 11a connects a first process chamber 29a and a second process chamber 29b via a first port 27a and a second port 27b, respectively. A second interface 11b connects a third process chamber 29c and a fourth process chamber 29d via a third port 27c and a fourth port 27d respectively, and a third interface 11c connects a fifth process chamber 29e via a fifth port 27e. Within the second fabrication tool 41b a first interface 11a' connects a first process chamber 29a' and a second process chamber 29b' via a first port 27a' and a second port 27b', respectively, a second interface 11b' connects a third process chamber 29c' and a fourth process chamber 29d' via a third port 27c' and a fourth port 27d', respectively, and a third interface 11c connects a fifth process chamber 29e' via a fifth port 27e'. Each of the process chambers 29 in a pair may perform the same process or each may perform a distinct process. Further, each of the fabrication tools 41a, 41b may comprise a loadlock 43a, 43b, respectively, so that wafer carriers may be loaded directly to each of the fabrication tools 41a, 41b.

In an example operation, a first wafer carrier (not shown) is loaded to the first fabrication tool 41a via the first load lock 43a. The first load lock 43a is pumped down and the first wafer carrier is transferred along the conveyor 17 until it stops at a first interface 11a (provided the first interface 11a connects a process chamber to which wafers from the first wafer carrier are to be delivered). The wafer carrier then enters the interface and wafer/wafer carrier transport occurs as described with reference to FIGS. 1–3. While the first wafer carrier is indexing within the second portion 15 (see FIGS. 2A and 2B), other wafer carriers are able to travel along the conveyor 17 through the first portion 13 of the first interface 11a without obstruction by the first wafer carrier. After the wafers associated with the first wafer carrier have been processed and returned thereto, the first wafer carrier returns to the conveyor 17 and continues traveling along the conveyor 17 from one interface 11 to the next until processing within the first fabrication tool 41a is complete. The first wafer carrier may then travel directly to the second fabrication tool 4 1b via the pair of interfaces 11c, 11c' and the distant conveyor 33 connected thereto via a second port 27f, 27f' within the interfaces 11c, 11c', respectively, or may be removed from the first fabrication tool 41a via the first load lock 43a (provided the conveyor 17 is a two-way conveyor). Thereafter the wafer carrier continues its travel within the second fabrication tool 41b in the same manner as it travels through the first fabrication tool 41a.

Although FIG. 5 depicts the interfaces 11c, 11c' as connecting the first fabrication tool 41a and the second fabrication tool 41b at the back end thereof (i.e., the end opposite the loadlocks 43a, 43b) the interface 11 that connects the two fabrication tools may be located anywhere along the fabrication tools, and may connect each fabrication tool at a different location (e.g., the back end of one fabrication tool connects the front end of the next fabrication tool via the interfaces 11, 11' and the distant conveyor 33).

Through use of the present invention wafer carriers may advantageously be transferred directly from one fabrication tool to the next without being required to go through the loadlock of each fabrication tool. In this manner wafer transfer time is reduced as compared to that of prior art systems, the transfer between fabrication tools is fully automated and processing costs are thereby reduced.

Further, the use of the inventive interface allows the fabrication tool to be modular, to have a reduced footprint and to connect process chambers of varying size. Moreover, the use of the inventive interface enables each wafer transfer mechanism (the conveyor, the indexer/elevator and the wafer handlers associated with each process chamber) to perform only single axis movement. Single axis movement reduces the cost of the fabrication tool and increases wafer placement repeatability. Still further, with use of the present invention the delete wafer handler (the more precise wafer transfer mechanism) is required to move only a short distance as compared to that required of prior art systems, further increasing repeatability and reducing costs.

Numerous inventive interfaces can be used within a fabrication tool to reduce the fabrication tool's cost, footprint and wafer transfer time. Not only can the inventive interface connect one or more process chambers, it may also function as a buffer station, a location for side saddle processes such as orient or cool down, or can facilitate factory wide automation by directly interconnecting a collection of fabrication tools.

The foregoing description discloses only the preferred embodiments of the invention, modifications of the above disclosed apparatus and method which fall within the scope of the invention will be readily apparent to those of ordinary skill in the art. For instance, although an over-head conveyor is presently preferred, other types of conveyors could be used. In a system which employs a belt or rolling element type conveyor, the indexer/elevator could pick the wafer carrier up from overhead. The layouts of the fabrication tools shown in FIG. 5 are merely examples showing the preferred layout; the inventive interface provides for modular fabrication tools which can be configured to conform to the space available. The conveyors, like the interface, can be contained within a vacuum environment depending upon the needs of the specific application. Moreover, although the interface preferably comprises two portions, additional portions may be employed in the same manner for connecting additional wafer transfer mechanisms and thereby further expanding networking capabilities.

Accordingly, while the present invention has been disclosed in connection with the preferred embodiments thereof, it should be understood that other embodiments may fall within the spirit and scope of the invention, as defined by the following claims.

What is claimed is:

1. An interface comprising:
   a chamber having:
      a first portion configured to allow a conveyor transporting a wafer carrier containing at least one wafer to pass therethrough; and
      a second portion configured to contain a wafer carrier containing at least one wafer without obstructing the operation of the conveyor, and without obstructing the passage of a wafer carrier containing at least one wafer being transported by the conveyor, the first and second portions being operatively coupled such that a wafer carrier containing at least one wafer may be elevated therebetween while remaining within the chamber;
   an elevator adapted to move wafer carriers between the first portion and the second portion;
   and wherein the second portion comprises:
      a first port adapted to connect to a first process chamber; and
      a second port adapted to connect to a second process chamber,
      the first port comprising a first wafer handler adapted to transfer at least one wafer between the elevator and the first process chamber, and the second port comprising a second wafer handler adapted to transfer at least one wafer between the elevator and the second process chamber.

2. The interface of claim 1 wherein the second portion is configured such that a first wafer carrier within the second portion indexing between a first position and a second position does not obstruct the passage of a second wafer carrier traveling through the first portion.

3. The interface of claim 2 further comprising a pod-engaging mechanism operatively coupled to the elevator and adapted to open a cover portion of a wafer carrier elevated thereby.

4. The interface of claim 1 wherein the first port and the second port are at the same elevation.

5. The interface of claim 1 wherein the first port and the second port are positioned at different elevations.

6. The interface of claim 5 wherein the elevation of the first port and the elevation of the second port are such that when the first wafer handler is aligned adjacent a first wafer of a wafer carrier positioned on the elevator, the second wafer handler is aligned adjacent a second wafer of a wafer carrier positioned on the elevator, wherein the first wafer and the second wafer are consecutively located within the wafer carrier with no wafers located between the first and second wafer.

7. The interface of claim 5 wherein the first port and the second port are spaced by half the distance of a set of active wafer carrier slots contained within a wafer carrier to be positioned within the second portion of the interface.

8. The interface of claim 1 wherein the second portion further comprises a sealable opening adapted to isolate the second portion from the first portion.

9. The interface of claim 1 further comprising a pod-opening mechanism operatively coupled to the elevator and adapted to open a wafer carrier elevated thereby.

10. An automated semiconductor processing system comprising:
   a first semiconductor device fabrication tool comprising:
      at least a first process chamber;
      at least a first interface, the first interface comprising a chamber having:
         a first portion configured to allow a conveyor transporting a wafer carrier containing at least one wafer to pass therethrough; and
         a second portion configured to contain a wafer carrier containing at least one wafer without obstructing the operation of the conveyor, and without obstructing the passage of a wafer carrier containing at least one wafer being transported by the conveyor, the first and second portions being operatively coupled such that a wafer carrier containing at least one wafer may be elevated therebetween while remaining within the chamber;
      an elevator adapted to move wafer carriers between the first portion and the second portion;
      and wherein the second portion comprises:
         a first port connected to the first process chamber; and
         a second port adapted to connect to a second process chamber,
         the first port comprising a first wafer handler adapted to transfer at least one wafer between the elevator and the first process chamber, and the second port comprising a second wafer handler adapted to transfer at least one wafer between the elevator and the second process chamber; and
      a first conveyor which extends through the first portion of the first interface, wherein the first and second portions of the first interface are configured such that a first wafer carrier within the second portion of the first interface may index between a first position and a second position without obstructing the passage of a second wafer carrier traveling through the first portion of the first interface;
   a second semiconductor device fabrication tool comprising:
      at least a third process chamber;
      at least a second interface coupled to the third process chamber, the second interface comprising a chamber having:

a first portion configured to allow a conveyor transporting a wafer carrier containing at least one wafer to pass therethrough; and a second portion configured to contain a wafer carrier containing at least one wafer without obstructing the operation of the conveyor, and without obstructing the passage of a wafer carrier containing at least one wafer being transported by the conveyor, the first and second portions being operatively coupled such that a wafer carrier containing at least one wafer may be elevated therebetween while remaining within the chamber;

an elevator adapted to move wafer carriers between the first portion and the second portion;

and wherein the second portion comprises:

a first port connected to the third process chamber; and a second port adapted to connect to a fourth process chamber, the first port comprising a first wafer handler adapted to transfer at least one wafer between the elevator and the third process chamber, and the second port comprising a second wafer handler adapted to transfer at least one wafer between the elevator and the fourth process chamber; and a second conveyor which extends through the first portion of the second interface, wherein the first and second portions of the second interface are configured such that a first wafer carrier within the second portion of the second interface may index between a first position and a second position without obstructing the passage of a second wafer carrier traveling through the first portion of the second interface; and a third conveyor coupled to the second port of the first interface and to the second port of the second interface, wherein the first and second semiconductor device fabrication tools are coupled via the third conveyor and the first and second interfaces.

11. The automated semiconductor processing system of claim 10 wherein the first semiconductor device fabrication tool further comprises a third interface, coupled to the first conveyor and adapted to connect a fifth process chamber and a sixth process chamber to the first conveyor.

12. The automated semiconductor process system of claim 10 wherein the second portion of the first interface further comprises a pod opening mechanism adapted to open a wafer carrier.

13. A method of transporting wafer carriers comprising:

conveying a first wafer carrier containing a plurality of wafers via a conveyor to a first portion of an interface connecting a first process chamber and a second process chamber to the conveyor, the conveyor passing through the first portion;

elevating the first wafer carrier to a second portion of the interface which is at a level adjacent the first and second process chambers;

loading a first wafer to the first process chamber via a first port in the second portion of the interface; and loading a second wafer to the second process chamber via a second port in the second portion of the interface.

14. The method of claim 13 wherein the step of loading the first wafer and the step of loading the second wafer occur simultaneously.

15. The method of claim 13 wherein the step of elevating the first wafer carrier further comprises opening a cover portion of the first wafer carrier.

16. The method of claim 13 wherein the step of elevating the first wafer carrier comprises raising the elevator to contact the first wafer carrier being transported by an overhead transport system and thereby causing the overhead transport system to release the first wafer carrier.

17. The method of claim 13 further comprising the step of conveying a second wafer carrier through the first portion of the interface while the first wafer carrier is in the second portion of the interface.

18. A method of conveying wafer carriers comprising:

providing an interface comprising a chamber having a first and a second portion;

conveying a wafer carrier via a first conveyor into the first portion of the interface, the interface connecting the first conveyor with a distant conveyor; and elevating the wafer carrier to the second portion of the interface which is at a level adjacent the distant conveyor.

19. The method of claim 18 further comprising conveying a wafer carrier via the first conveyor to a first portion of a second interface connecting the first conveyor with a second distant conveyor; and elevating the wafer carrier to a second portion of the interface which is at a level adjacent the second distant conveyor.

20. The method of claim 18 wherein conveying the wafer carrier via a first conveyor further comprises conveying the wafer carrier via the first conveyor to a plurality of interfaces, each having a first and a second portion, wherein each of the interfaces connects the first conveyor via the first portion of the interface to one of a plurality of distant conveyors via the second portion of the interface.

21. An interface between a first process chamber and a second process chamber comprising:

an elevator chamber comprising an elevator, a first portion configured to allow a conveyor transporting a wafer carrier containing at least one wafer to pass therethrough, and a second portion having:

a first port adapted to connect to the first process chamber; and a second port adapted to connect to the second process chamber;

the first port comprising a first wafer handler adapted to employ only single-axis movement during transfer of at least one wafer between the elevator chamber and the first process chamber, and the second port comprising a second wafer handler adapted to employ only single-axis movement during transfer of at least one wafer between the elevator chamber and the second process chamber.

22. An interface comprising:

a first portion configured to allow a conveyor transporting a wafer carrier to pass therethrough; and a second portion having:

a first port adapted to connect to a first process chamber, the first port comprising a first wafer handler adapted to transfer at least one wafer between the second portion and the first process chamber;

a second port adapted to connect to a second process chamber, the second port comprising a second wafer handler adapted to transfer at least one wafer between the second portion and the second process chamber;

a pod opening mechanism adapted to open a wafer carrier;

an elevator adapted to elevate a wafer carrier between the first and second portions; and a conveyor which extends through the first portion, wherein the first and second portions are configured such that a first wafer carrier within the second portion may index between a first position and a second position without obstructing the passage of a second wafer carrier traveling through the first portion.

23. The interface of claim 22 further comprising a door adapted to seal the first portion from the second portion, and a cover engaging mechanism adapted to support a cover portion of a wafer carrier while a base portion of the wafer carrier descends therefrom.

24. The interface of claim 23 wherein the cover engaging mechanism is adapted to seal against the cover portion of the wafer carrier so as to seal the first portion from the second portion.

25. A method of transporting wafer carriers comprising:

transferring a first wafer carrier containing a plurality of wafers via a transfer mechanism to a first portion of an interface connecting a first process chamber and a second process chamber to the transfer mechanism;

elevating the first wafer carrier to a second portion of the interface at a level adjacent the first and second process chambers;

opening a cover portion of the first wafer carrier while elevating the first wafer carrier;

loading a first wafer to the first process chamber via a first port in the second portion of the interface;

loading a second wafer to the second process chamber via a second port in the second portion of the interface;

wherein the step of loading the first wafer and the step of loading the second wafer occur simultaneously; and transferring a second wafer carrier containing a plurality of wafers via the transfer mechanism through the first portion of the interface while the first wafer carrier is in the second portion of the interface.

26. A method of transporting wafer carriers comprising:

conveying a first covered wafer carrier containing at least one wafer via a conveyor to a first portion of an interface through which the conveyor extends;

lowering the first covered wafer carrier to a second portion of the interface;

opening the first covered wafer carrier;

sealing the first portion of the interface from the second portion of the interface via the cover portion of the first covered wafer carrier; and conveying a second covered wafer carrier through the first portion of the interface while the first wafer carrier is in the second portion of the interface.

27. The method of claim 26 further comprising processing the at least one wafer within the second portion of the interface.

28. The method of claim 26 wherein lowering the first covered wafer carrier comprises sealing a bottom portion of the covered wafer carrier to an elevator platform.

29. The method of claim 28 wherein lowering the first covered wafer carrier further comprises separating the elevator platform into a cover supporting part and a wafer carrier supporting part, and lowering the wafer carrier supporting part away from the cover supporting part.

* * * * *